US008696217B2

(12) United States Patent
Taniguchi et al.

(10) Patent No.: US 8,696,217 B2
(45) Date of Patent: Apr. 15, 2014

(54) SEMICONDUCTOR LASER MODULE AND OPTICAL MODULE

(75) Inventors: Hidehiro Taniguchi, Tokyo (JP); Jun Miyokawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 247 days.

(21) Appl. No.: 13/256,434

(22) PCT Filed: Mar. 12, 2010

(86) PCT No.: PCT/JP2010/054215
§ 371 (c)(1),
(2), (4) Date: Oct. 18, 2011

(87) PCT Pub. No.: WO2010/106978
PCT Pub. Date: Sep. 23, 2010

(65) Prior Publication Data
US 2012/0027352 A1    Feb. 2, 2012

(30) Foreign Application Priority Data

Mar. 18, 2009  (JP) .................................. 2009-065556

(51) Int. Cl.
*G02B 6/36* (2006.01)
(52) U.S. Cl.
USPC .................... 385/91; 385/88; 385/89; 385/92
(58) Field of Classification Search
USPC ...................................................... 385/90, 91
See application file for complete search history.

(56) References Cited

U.S. PATENT DOCUMENTS

| 5,745,625 | A  | * | 4/1998 | Aikiyo et al. | 385/94 |
| 6,094,515 | A  | * | 7/2000 | Miki et al. | 385/31 |
| 6,516,130 | B1 | * | 2/2003 | Jang | 385/136 |
| 6,571,041 | B2 | * | 5/2003 | Bourcier et al. | 385/52 |
| 6,606,435 | B1 | * | 8/2003 | Irie et al. | 385/52 |

(Continued)

FOREIGN PATENT DOCUMENTS

| JP | 09-033769 | 2/1997 |
| JP | 2001-272577 | 10/2001 |

(Continued)

OTHER PUBLICATIONS

International Patent Application No. PCT/JP2010/054215: International Search Report dated Apr. 6, 2010, 2 pages.

*Primary Examiner* — Rhonda Peace
(74) *Attorney, Agent, or Firm* — Baker & Hostetler LLP

(57) ABSTRACT

The present invention provides a semiconductor laser module in which a coupling efficiency does not easily vary even though a displacement amount varies by the effect of welding. The semiconductor laser module comprises: a semiconductor laser element 2 for emitting a laser light whose cross-sectional shape at an emission end face is elliptical; an optical fiber 3 arranged to receive the laser light from the semiconductor laser element 2; a package 4 for housing the semiconductor laser element 2 and the optical fiber 3; a first fastening means 117 for fastening the optical fiber 3 to the package 4; and a second fastening means 7 for fastening the semiconductor laser element 2 to the package 4, wherein the semiconductor laser element 2 and the optical fiber 3 are fastened such that a minor axis of the elliptical shape of the laser light becomes parallel to a line connecting both ends of the optical fiber 3, said both ends being restricted by the first fastening means 117.

6 Claims, 12 Drawing Sheets

(56) References Cited

U.S. PATENT DOCUMENTS

| | | | |
|---|---|---|---|
| 6,669,379 B2* | 12/2003 | Janosik et al. | 385/91 |
| 6,769,819 B2* | 8/2004 | Tanaka et al. | 385/92 |
| 6,846,113 B2* | 1/2005 | Yeh et al. | 385/88 |
| 6,966,707 B2* | 11/2005 | Yamada et al. | 385/88 |
| 7,068,882 B2* | 6/2006 | Saito et al. | 385/33 |
| 7,738,747 B2* | 6/2010 | Miyokawa et al. | 385/14 |
| 8,213,481 B2* | 7/2012 | Miyokawa | 372/107 |
| 2001/0026664 A1* | 10/2001 | Tanaka et al. | 385/92 |
| 2002/0001324 A1* | 1/2002 | Miyokawa et al. | 372/43 |
| 2002/0005522 A1* | 1/2002 | Miyokawa et al. | 257/79 |
| 2002/0009106 A1* | 1/2002 | Miyokawa et al. | 372/36 |
| 2002/0015560 A1* | 2/2002 | De Donno et al. | 385/38 |
| 2002/0015566 A1* | 2/2002 | Mun et al. | 385/88 |
| 2002/0031300 A1* | 3/2002 | Jie et al. | 385/33 |
| 2002/0126965 A1* | 9/2002 | Miyokawa | 385/92 |
| 2002/0154872 A1* | 10/2002 | Miyokawa | 385/92 |
| 2002/0197021 A1* | 12/2002 | Kusunoki | 385/88 |
| 2003/0048987 A1* | 3/2003 | Saito et al. | 385/33 |
| 2004/0033034 A1* | 2/2004 | Miyokawa et al. | 385/93 |
| 2004/0114878 A1* | 6/2004 | Yamada et al. | 385/88 |
| 2004/0264891 A1* | 12/2004 | Namiwaka et al. | 385/93 |
| 2012/0027352 A1* | 2/2012 | Taniguchi et al. | 385/51 |

FOREIGN PATENT DOCUMENTS

| | | | |
|---|---|---|---|
| JP | 2002-350687 | 12/2002 | |
| JP | 2004233566 A * | 8/2004 | G02B 6/10 |
| JP | 2005-148466 | 6/2005 | |

* cited by examiner

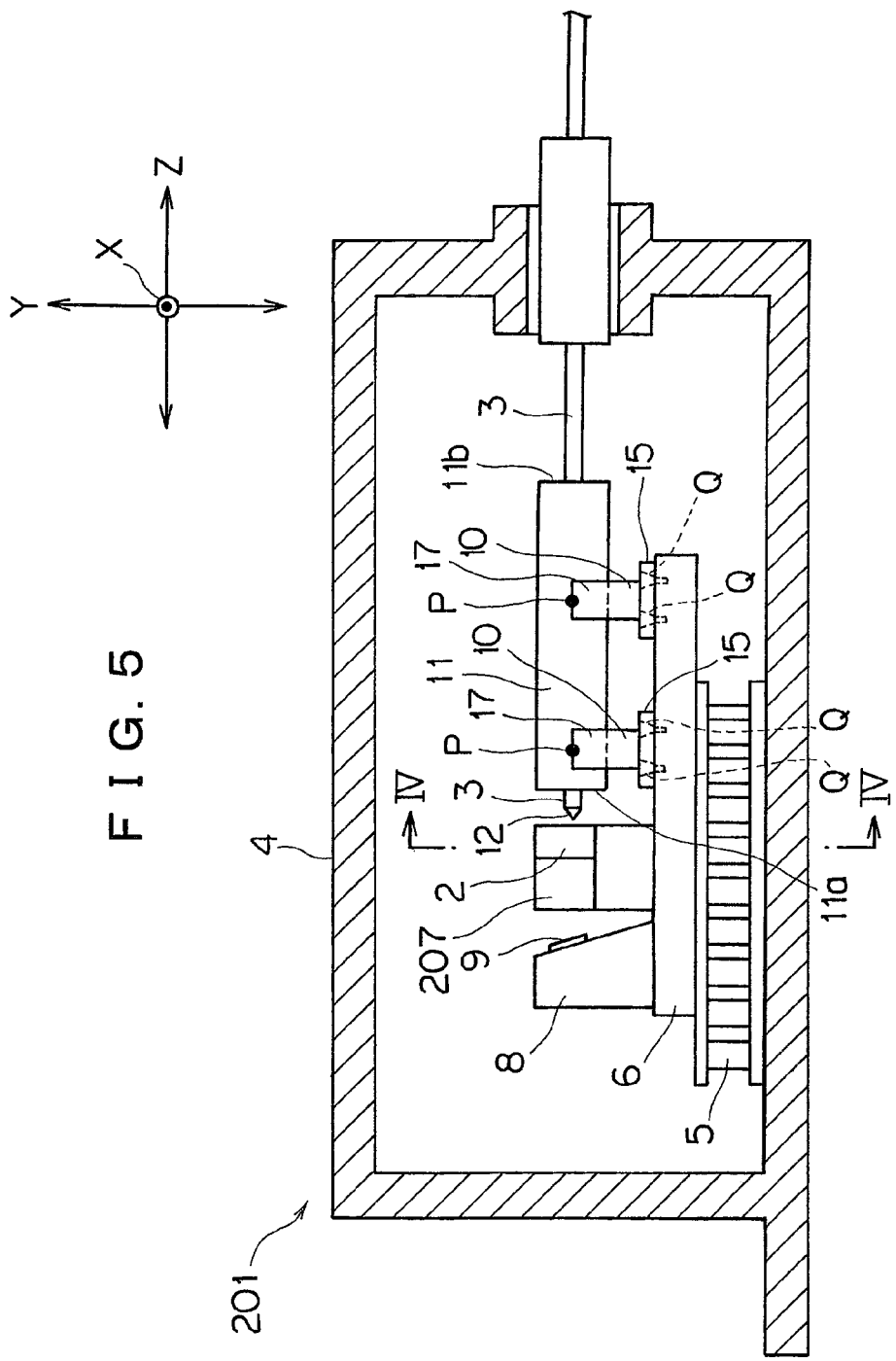

F I G. 1 0
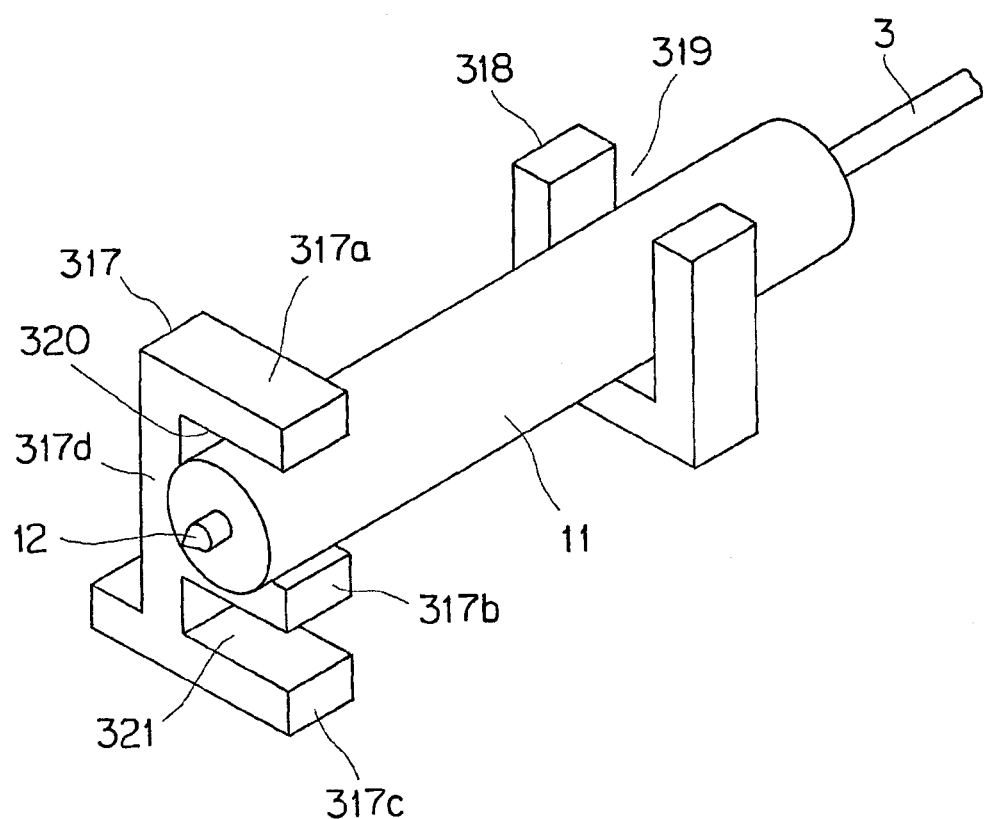

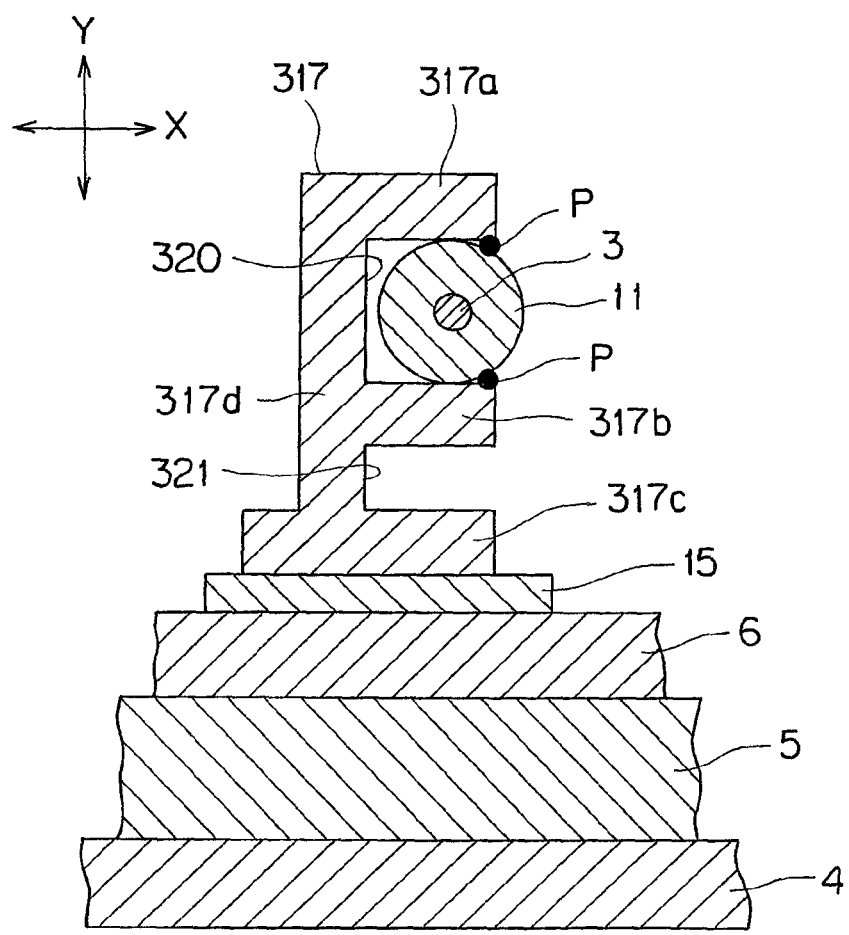
F I G. 1 1

SEMICONDUCTOR LASER MODULE AND OPTICAL MODULE

CROSS-REFERENCE TO RELATED APPLICATIONS

This application is the National Stage of International Application No. PCT/JP2010/054215, filed Mar. 12, 2010, which claims the benefit of Japanese Patent Application No. 2009-065556, filed Mar. 18, 2009, the disclosure of which is incorporated herein by reference in its entirety.

TECHNICAL FIELD

The present invention relates to a semiconductor laser module used for optical communications and, in particular, to a semiconductor laser module and an optical module for connecting an optical cable or an optical code.

BACKGROUND ART

Recently, a large number of semiconductor lasers (laser diodes) have been used as signal light sources or excitation light sources of optical fiber amplifiers in optical communications. When a semiconductor laser is used as a signal light source or an excitation light source in optical communications, it is mostly used as a semiconductor laser module in which a laser light from the semiconductor laser is optically coupled to an optical fiber.

FIG. 7 shows a schematic cross-sectional view of one structural example of a semiconductor laser module. The semiconductor laser module 1 is obtained by placing a semiconductor laser element 2 and an optical fiber 3 in an optical coupling state and by accommodating and arranging them inside a package 4.

In this semiconductor laser module 1, a temperature control module (peltier module) 5 is fastened inside the package 4. A metallic base 6 is fastened on the temperature control module 5. The semiconductor laser element 2 is fastened above the top face of the base 6 via an LD carrier 7. A photo diode 9 is fastened via a PD carrier 8. A thermistor (not shown) is arranged near the semiconductor laser element 2.

The photo diode 9 monitors a light emitting state of the semiconductor laser element 2, and the temperature control module 5 controls the temperature of the semiconductor laser element 2. The operation of this temperature control module 5 is controlled based on the temperature detected by the thermistor so that the semiconductor laser element 2 is kept at a constant temperature. By the temperature control of the semiconductor laser element 2 performed by the temperature control module 5, the intensity variation and the wavelength variation of the laser light of the semiconductor element 2, which results from the variation in temperature of the semiconductor laser element 2, are suppressed. This enables the intensity and the wavelength of the laser light from the semiconductor laser element 2 to be kept almost constant.

Furthermore, a ferrule 11 is fastened to the base 6 by a fastening member 17. The ferrule 11 is made of metal, such as Fe—Ni—Co alloy (kovar (trademark)) and formed to have, for example, a cylindrical shape. A through hole (not shown) piercing from the front end face 11$a$ to the rear end face 11$b$ is formed inside the ferrule 11. The optical fiber 3 is inserted into this through hole and fastened by, for example, soldering.

As shown in FIGS. 8 and 9, the fastening members 17 are composed of a pair of fastening parts 10$a$ and 10$b$ (10$a$' and 10$b$') arranged and fastened on the base part 15 with a space therebetween. The fastening members 17 are fastened to the base 6, for example, at the positions Q by laser welding (for example, YAG laser welding).

At a front side part near the semiconductor laser element 2 and at a rear side part far from the semiconductor laser element 2, the side face of the ferrule 11 is sandwiched from both sides by the pair of the fastening parts 10 (10$a$, 10$b$, 10$a$', and 10$b$') of the fastening members 17. Then, the ferrule 11 is fastened to the fastening parts 10 (10$a$, 10$b$, 10$a$', and 10$b$') by laser welding (for example, YAG laser welding).

To enhance a coupling efficiency, the center of the semiconductor laser element 2 and the center of the optical fiber 3 are adjusted to agree with each other as much as possible. However, in the case of such a structure in which the fastening part is fastened by laser welding, a part to be joined is locally heated and this brings about the situation where the position of the ferrule 11 is displaced with respect to the semiconductor laser element 2 due to melting or solidification contraction of metal. Therefore, there is a manufacturing method in which, before laser welding, the aligning position of the ferrule 11 is displaced in advance by the amount that the ferrule 11 is to be displaced by welding and then the ferrule 11 is returned to the aligning position after welding (see, for example, Patent Document 1).

CONVENTIONAL ART DOCUMENT

Patent Document

Patent Document 1: JP-A-2003-57498

SUMMARY OF THE INVENTION

Problem to be Solved by the Invention

As described above, in the conventional method, the position is displaced in advance by the amount that the ferrule is to be displaced by welding. However, even through such a method is applied, as the displacement amount largely varies depending on an individual product, there is a problem that a coupling efficiency varies.

The present invention is made considering the above-described circumstances and an object of the present invention to provide a semiconductor laser module and an optical module in which a coupling efficiency does not easily vary even though a displacement amount varies by the effect of welding.

Means for Solving the Problem

In order to solve the above problem, a semiconductor laser module of the present invention comprises: a semiconductor laser element for emitting a laser light whose cross-sectional shape at an emission end face is elliptical; an optical fiber arranged to receive the laser light from the semiconductor laser element; a package for housing the semiconductor laser element and the optical fiber; a first fastening means for fastening the optical fiber to the package; and a second fastening means for fastening the semiconductor laser element to the package, wherein the semiconductor laser element and the optical fiber are fastened such that a minor axis of the elliptical shape of the laser light becomes parallel to a line connecting both ends of the optical fiber, said both ends being restricted by the first fastening means.

Furthermore, the fastening after alignment may be one of fastening by welding, fastening by soldering, fastening by adhesive, and fastening by low-melting glass.

Furthermore, the optical fiber may be a wedge-shaped lensed fiber, and the present invention may be constituted such that a direction of an edge line of the wedge shape agrees with that of a major axis direction at the emission end face of the laser light.

Furthermore, the optical fiber may be mounted in a groove provided for the first fastening means and may be fastened at both ends of the groove, or the optical fiber may be arranged on a mounting face of the first fastening means and partially fastened by sides of pieces at both side faces of the optical fiber.

Furthermore, the semiconductor laser element may be fastened such that the major axis of the elliptical cross-sectional shape at the emission end face of the laser light emitted from the semiconductor laser element becomes parallel to a bottom plate of the package; and, after alignment, the optical fiber may be fastened on a side face of the mounting face of the first fastening means provided vertically to the bottom plate of the package.

Furthermore, the semiconductor laser element may be fastened such that the major axis of the elliptical cross-sectional shape at the emission end face of the laser light emitted from the semiconductor laser element becomes vertical to the bottom plate of the package; and, after alignment, the optical fiber may be fastened on the mounting face of the first fastening means provided parallel to the bottom plate of the package.

Furthermore, an optical module comprises a structure of optically coupling a first optical part for emitting a light and a second optical part on which the light is incident, wherein at least one of a cross section at an emission end face of a light emitted from the first optical part and a cross section at an incident end face of an incident part of the second optical part has an optical anisotropy; and when and/or after the optical part with the cross section having the optical anisotropy is fastened, a main direction of displacement is a major axis direction of the cross section having the optical anisotropy.

Effects of the Invention

In the semiconductor laser module according to the present invention, the semiconductor laser element and the optical fiber are fastened such that the minor axis direction of the elliptical shape of the laser light becomes parallel to the line connecting both ends restricted by the first fastening means. Thus, the optical fiber is displaced in the major axis direction, not in the minor axis direction. For this reason, if the displacement amount (length) caused by fastening is the same, in the case where the optical fiber is displaced in the major axis direction, the overlapping area between the area of the laser light and the area at the light receiving end face where the optical fiber receives the laser light becomes smaller than in the case where the optical fiber is displaced in the minor axis direction. Therefore, even though the displacement amount caused by fastening varies to some extent, as the optical fiber is displaced in the major axis direction, the high coupling efficiency can be maintained. Moreover, when a plurality of products are manufactured, it is possible to reduce the variation in coupling efficiency for each product.

BRIEF DESCRIPTION OF THE DRAWINGS

FIG. 5 is a model diagram showing a schematic cross-sectional view of one structural example of a semiconductor laser module according to a second embodiment of the present invention.

FIG. 10 is a schematic perspective view showing another embodiment of the fastening members in the first embodiment.

FIG. 11 is a front view showing the shape of the fastening member shown in FIG. 10 positioned on the side of the semiconductor laser element.

EMBODIMENTS FOR CARRYING OUT THE INVENTION

First Embodiment

Hereinafter, a first embodiment of the present invention is described with reference to the drawings.

Figure 1:
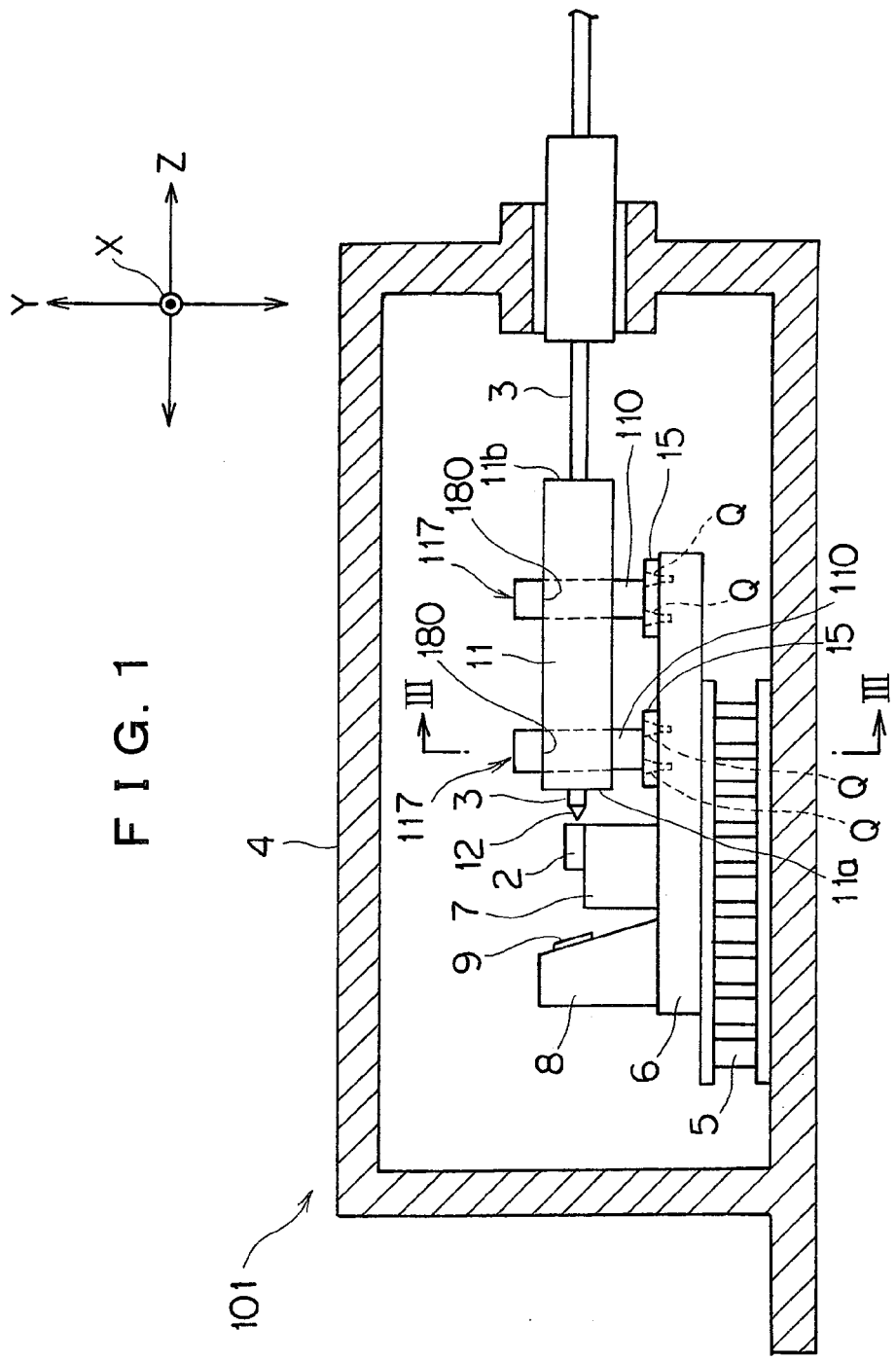
FIG. 1 is a model diagram showing a schematic cross-sectional view of one structural example of a semiconductor laser module according to a first embodiment of the present invention.

FIG. 1 is a schematic cross-sectional view of a semiconductor laser module. The same reference numerals are given to the same components as those shown in the conventional structure.

In the following explanation, an X-direction means the depth direction of the paper of FIG. 1, a Y-direction means the vertical direction of the paper of FIG. 1, and a Z-direction means the horizontal direction of the paper of FIG. 1.

A semiconductor laser module 101 includes a package 4 constituting the outer part of the semiconductor laser module; a semiconductor laser element 2; and an optical fiber 3. The semiconductor laser element 2 and the optical fiber 3 are provided inside the package 4.

A temperature control module 5 is mounted on the bottom of the package 4. A metallic base 6 is mounted on the temperature control module 5 such that they come in contact with each other. An LD carrier 7 and a PD carrier 8 are mounted on the top surface of the base 6. The semiconductor laser element 2 is fastened on the LD carrier 7. A photo diode 9 is fastened on the PD carrier 8.

The temperature control module 5 functions to absorb heat from the base 6 and cool it down. The heat transferred from the semiconductor laser element 2 to the base 6 is efficiently absorbed by the temperature control module 5.

Two fastening members 117 for fastening a ferrule 11 of the optical fiber 3 are provided on the top surface of the base 6. These fastening members 117 include two fastening parts 110, 110 having a space therebetween and provided on the line where the optical fiber 3 extends from a light emitting part of the above-described semiconductor laser element 2.

A tip part of the optical fiber 3 is protruded forward from a front end face 11a of the ferrule 11 and arranged to face the light emitting part (active layer) of the semiconductor laser element 2 with a space therebetween. The laser light emitted from the semiconductor laser element 2 is received by the tip of the optical fiber 3. In this example, the optical fiber 3 is a lensed fiber in which a lens 12 is formed at the tip.

Figure 2A:
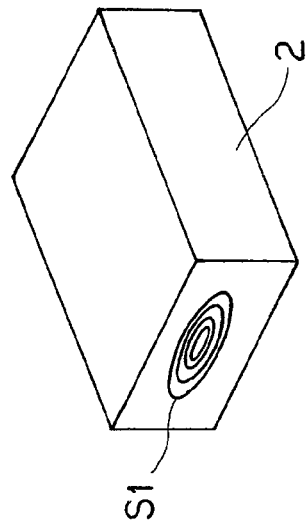
FIG. 2 is a schematic diagram for explaining the cross-sectional shape at an emission end face of a laser light emitted from a semiconductor laser element and the cross-sectional shape at an input end face where an optical fiber receives a laser light.
Figure 2C:
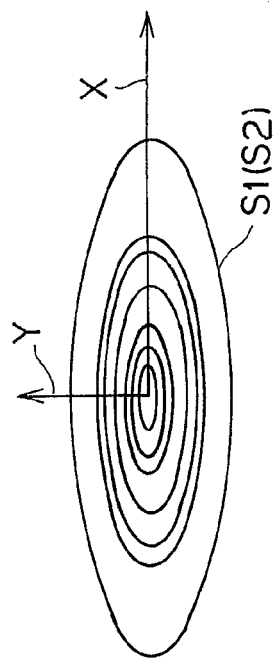
Figure 2B:
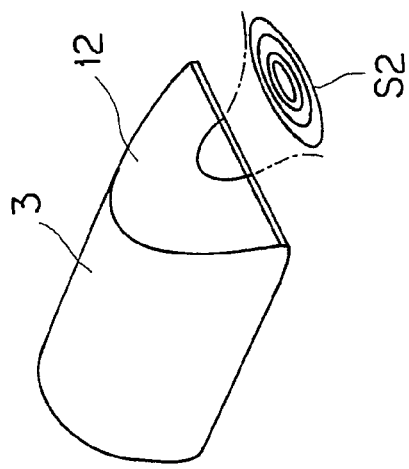

As shown in FIGS. 2(a) and 2(c), the laser light emitted from the semiconductor laser element 2 has the cross-sectional shape S1 at the emission end face. This cross-sectional shape S1 is an elliptical shape having the major axis in the X-direction (the direction parallel to the bottom plate of the package 4) and the minor axis in the Y-direction. As shown in FIGS. 2(b) and 2(c), the laser light received by the lens 12 positioned at the tip of the optical fiber 3 has the cross-sectional shape S2 at the light receiving end face. This cross-sectional shape S2 is almost the same shape as the cross-sectional shape S1.

The cross-sectional shapes S1 and S2 have the higher coupling efficiency as their overlapping area becomes larger. On the other hand, as their overlapping area becomes smaller, the coupling efficiency becomes lower.

The optical fiber 3 extracted from a rear end face 11b of the ferrule 11 is led outside the package 4. The laser light emitted from the semiconductor laser element 2 and entering the tip of the optical fiber 3 is propagated through the optical fiber 3 and led to a desired supplied place.

Figure 3A:
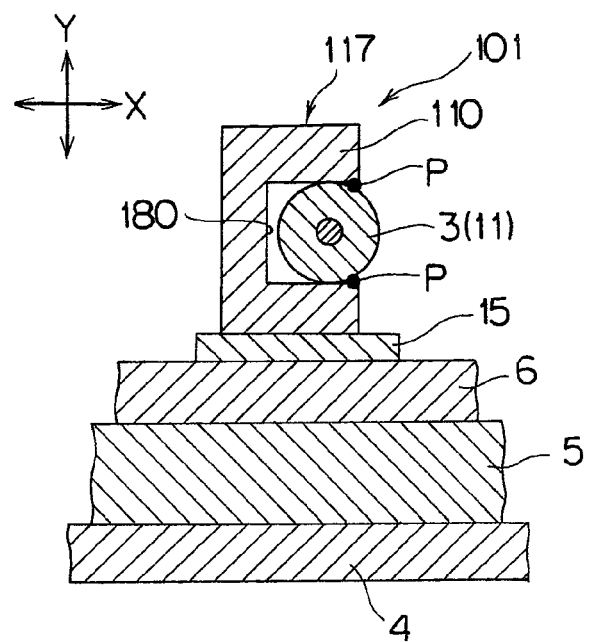
FIG. 3 is a cross-sectional view taken along the line of FIG. 1 and is a view in which an arranging and fastening part of a ferrule is excerpted and schematically shown.

FIG. 3(a) is a cross-sectional view taken along the line III-III of FIG. 1 and is a view in which the arranging and fastening part of the ferrule is excerpted and schematically shown. The two fastening parts 110 have the same structure.

The fastening member 117 includes at the lower side a base part 15 fastened to the base 6 by welding. The fastening part 110 is provided to extend from the base part 15 in the Y-direction (the vertical direction of FIG. 3(a)). A ferrule fastening groove 180 cut toward the inside from the side surface is formed in the fastening part 110.

The ferrule fastening groove 180 is formed to have almost the same length in the Y-direction as the diameter of the ferrule 11. The movement of the ferrule 11 in the Y-direction is restricted in the state where the ferrule 11 is incorporated into the groove 180.

The position of the ferrule fastening groove 180 in the Y-direction is set such that the center of the optical fiber 3 (more accurately, the center of the lens 12 positioned at the tip of the optical fiber 3) and the center of the light-emitting part of the semiconductor laser element 2 agree with each other in the state where the ferrule 11 is incorporated into the groove 180.

The depth of the ferrule fastening groove 180 in the X-direction is formed somewhat deeply such that the center of the optical fiber 3 and the center of the light-emitting part of the semiconductor laser element 2 can be adjusted in the X-direction in the state where the ferrule 11 is incorporated into the groove 180.

As shown in FIG. 3, at the upper part and the lower part in the X-direction, the ferrule 11 is fastened by welding, etc.

This fastening is performed at two positions P, P' of the fastening parts 110, 110 (totally four welding positions) on the side surfaces of the fastening parts 110, 110. In the case where the ferrule 11 is welded at the upper part and the lower part, it is displaced in the X-direction by the effect of the thermal expansion when welded.

Figure 7:
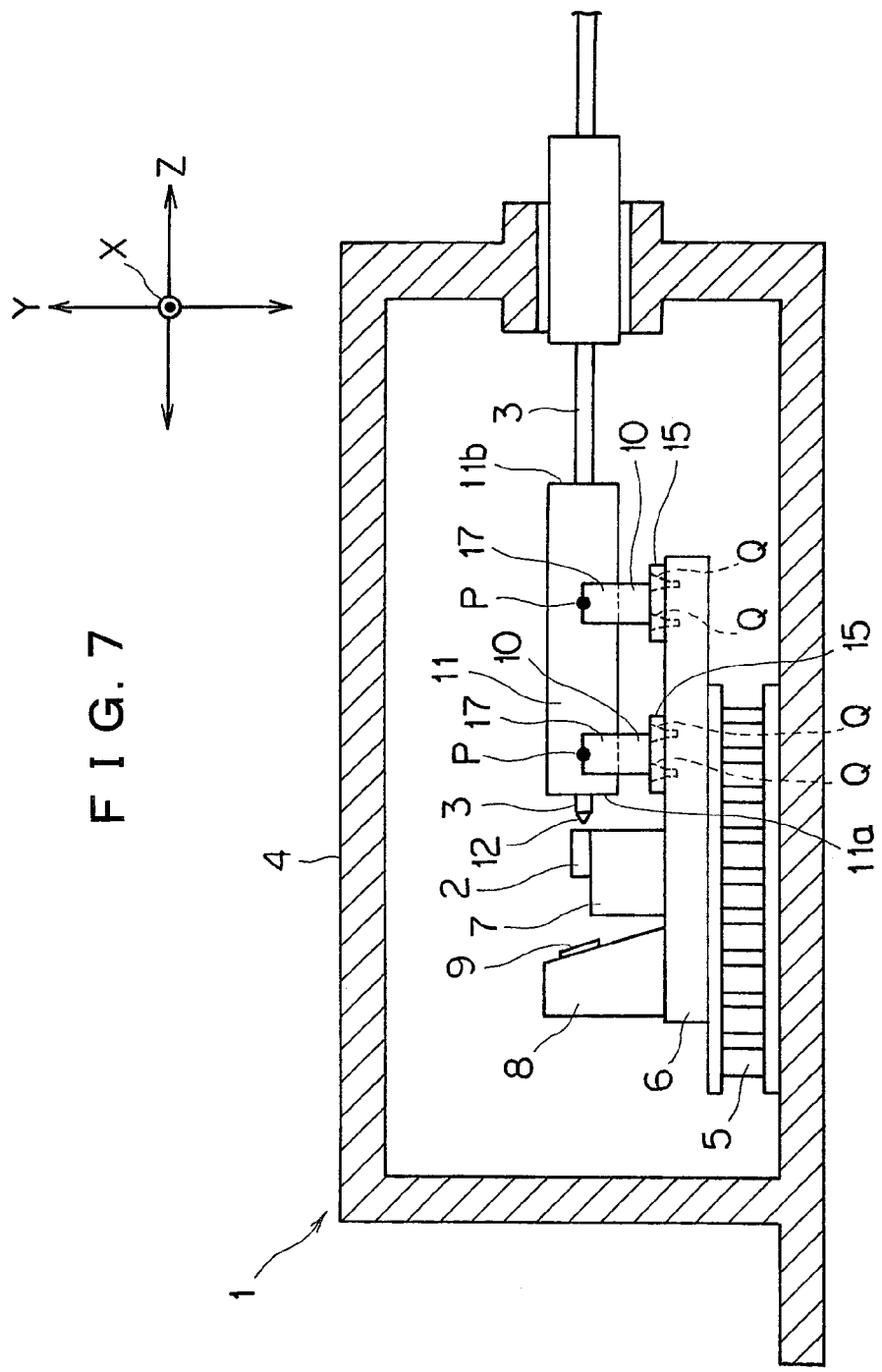
FIG. 7 is a model diagram showing a schematic cross-sectional view of a structure of a conventional semiconductor laser module.

In the conventional structure (see FIGS. 7, 8 and 9), both ends in the X-direction are fastened by welding, etc. Thus, the ferrule 11 is displaced in the Y-direction (the minor axis direction of the elliptical shape of the laser cross section at the emission end face) by the effect of the thermal expansion when it is welded.

In the semiconductor laser module 101 according to the first embodiment, the ferrule 11 is displaced in the X-direction (the major axis direction of the elliptical shape of the laser cross section at the emission end face).

Considering the workability in the package, it is convenient that the fastening member 117 includes an inclined face at the vicinity of the optical fiber. Moreover, although the optical fiber is fastened in the groove in the present embodiment, a fastening method is not limited to the groove and the optical fiber may be fastened by a projection, a metallic piece, and a plastic piece on the surface of the mounting part, or a combination thereof.

A method for fastening the optical fiber 3 to the fastening members 117 is performed according to the following processes:

First, the optical fiber 3 is inserted into the ferrule fastening grooves 180 of the two fastening parts 110. In this state, the movement of the optical fiber 3 in the Y-direction is restricted. Thus, the center of the optical fiber 3 and the center of the light emitting part of the semiconductor laser element 2 approximately agree with each other in the Y-direction (the minor axis direction of the laser light).

After the optical fiber 3 is aligned in the Y-direction, the position of the optical fiber in the X-direction is determined. As the optical fiber is displaced due to heat caused by welding the fastening parts 110 and the ferrule 11, the position in the X-direction is determined considering the amount that the optical fiber 3 is to be displaced by the heat in advance. That is, after the heat deformation, the position in the X-direction is determined such that the center of the optical fiber 3 and the center of the semiconductor laser element 2 approximately agree with each other.

Then, the ferrule 11 and the fastening parts 110, 110 are welded at the above-described welding positions P, P'. This enables the center of the optical fiber 3 and the center of the semiconductor laser element 2 to approximately agree with each other in the X-direction.

In this way, the present invention is constituted such that the displacement caused by welding occurs in the X-direction. This constitution aims at making the displacement occur along the major axis direction of the elliptical cross section of the laser light emitted by the semiconductor laser element 2 at the emission end face. That is, as shown in FIG. 4(c), if the displacement is adjusted in the Y-direction (the minor axis direction of the elliptical shape shown by the solid line in FIG. 4(c)), the small amount of the displacement (shown by the horizontal axis of the graph in FIG. 4(c)) significantly reduces the overlapping area between the cross-sectional shape S1 of the laser light at the emission end face and the cross-sectional shape S2 at the light receiving end face where the optical fiber 3 receives the laser light. Thus, the coupling efficiency (shown by the vertical axis of the graph in FIG. 4(c)) decreases.

Figure 4A:
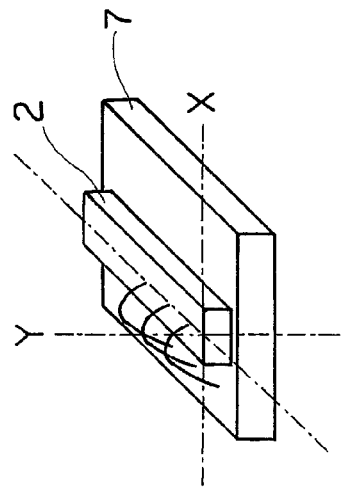
FIG. 4 shows the relationship between a displacement amount by welding and a binding efficiency in the X-direction and the Y-direction.
Figure 4B:
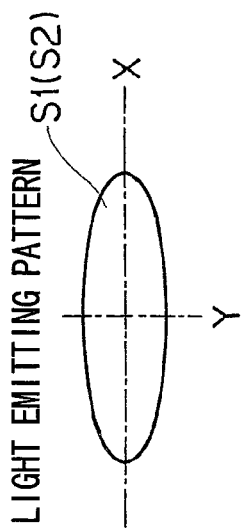
Figure 4C:
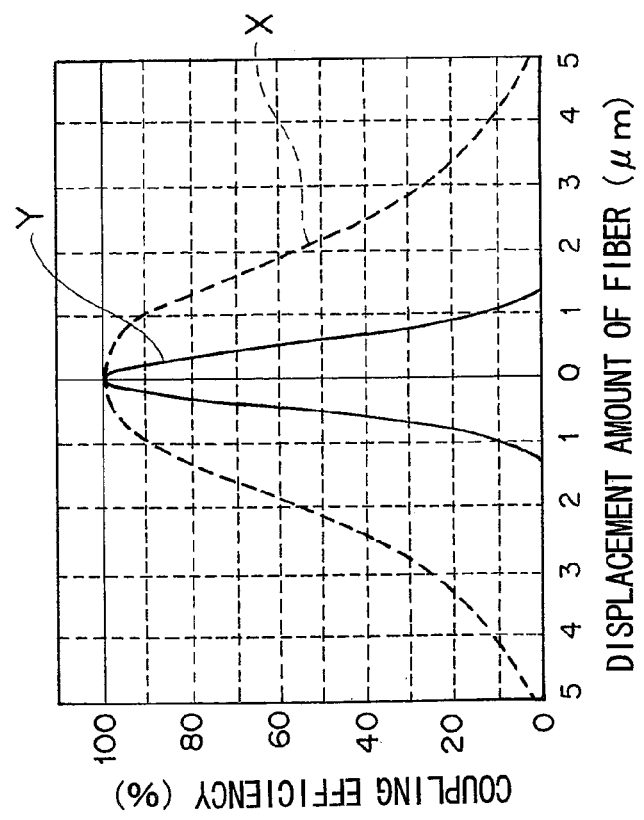

For example, as shown in the graph in FIG. 4, if the displacement of 0.5 µm occurs in the Y-direction, the coupling efficiency is decreased by 40%.

On the other hand, if the displacement is adjusted in the X-direction (the major axis direction of the elliptical shape), the same amount of the displacement does not significantly reduce the overlapping area between the cross-sectional shapes S1 and S2. Thus, the ratio where the coupling efficiency is decreased can be suppressed to be small.

For example, as shown in the graph in FIG. 4, if the displacement of 0.5 µm occurs in the X-direction, the coupling efficiency is decreased by only several percents.

Next, another embodiment of the above-described fastening member 117 is described with reference to FIGS. 10 and 11.

In the above-described structure, the ferrule 11 cannot be adjusted in the Y-direction (the vertical direction). However, the following structure enables the ferrule 11 to be finely adjusted in the Y direction (the vertical direction). In this structure, a tip side fastening member 117 positioned on the side of the semiconductor laser element 2 has a different shape from that of a rear side fastening member 318.

As shown in FIGS. 10 and 11, a tip side fastening member 317 is formed to have a schematically "E" shape when seen from the tip side of the ferrule 11. The tip side fastening member 317 includes: an upper stage support part 317a positioned at the top and extending approximately horizontally; a middle stage part 317b positioned below the upper stage support part 317a and extending approximately horizontally; a bottom part 317c positioned at the bottom; and a vertical support part 317d for vertically connecting these support parts on the left side.

A ferrule fastening groove 320 is formed between the upper stage support part 317a and the middle stage support part 317b. The ferrule 11 is inserted into this ferrule fastening groove 320 from an opening part on the right side of the tip fastening member 317. The ferrule fastening groove 320 is formed to have the approximately same length in the Y-direction (the gap length between the upper stage support part 317a and the middle stage support part 317b) as the outer diameter of the ferrule 11. That is, the position of the ferrule 11 in the Y-direction is determined when the ferrule 11 is fit into the ferrule fastening groove 320. On the other hand, the position in the X-direction can be arbitrarily adjusted, similarly to the above described embodiment.

Furthermore, a twisted groove 321 is formed between the middle stage support part 317b and the bottom part 317c. This twisted groove is used to finely adjust the position of the ferrule 11 in the Y-direction. That is, by slightly (several micrometers) moving the ferrule 11 upward and downward after the ferrule 11 is inserted into the ferrule fastening groove 320, this twisted groove 321 (more accurately, the vertical support part 317d positioned on the left side of the space S2) is twisted and bent, which changes the position of the whole tip fastening member 317 in the Y direction. Thus, the ferrule 11 can be finely adjusted in the Y-direction by this positional change.

As shown in FIG. 10, the rear side fastening member 318 is formed to have the "U" shape. The ferrule 11 is inserted into the inside from the upper opening part 319. At this time, the position of the ferrule 11 is not limited in the Y-direction. Thus, the movement of the ferrule 11, finely adjusted in the Y-direction by the tip side fastening member 317, can be absorbed by the rear side fastening member 318.

The mounting procedure of the ferrule 11 is explained. First, the ferrule 11 is inserted into the tip side fastening member 317 and the rear side fastening member 318.

At this time, the major axis of the elliptical shape S1 of the laser light becomes parallel to the X-direction.

Next, the position of the ferrule 11 is adjusted in the tip side fastening member 317. In the X-direction, the position of the ferrule 11 is determined to a position displaced by the amount that the ferrule 11 is to be displaced by heat when fastening is made by YAG welding, etc. In the Y-direction, the ferrule 11 is basically restricted by the ferrule fastening groove 320. However, by slightly moving the ferrule 11 upward and downward, the elliptical shape S1 of the laser light and the elliptical shape S2 at the light receiving face can be finely position-adjusted in the Y-direction. At this time, the position in the Y-direction is absorbed by the rear fastening member 318.

In this state, the ferrule 11 is fastened to the tip side fastening member 317 and the rear side fastening member 318 by YAG welding, etc. The ferrule 11 is moved in the X-direction by the welding heat and thus fastened to an optimum position where the overlapping area between the elliptical shape S1 of the laser light and the elliptical shape S2 at the light receiving end face becomes large.

The semiconductor laser module 101 according to the first embodiment of the present invention has the following effects:

That is, since the fastening members 117 for fastening the ferrule 11 of the optical fiber 3 by welding are provided, and the ferrule fastening grooves 180 of the fastening members 117 are formed to restrict the movement in the minor axis direction (the Y-direction) of the elliptical shape of the laser light, the displacement of the ferrule 11 in the minor axis direction can be restricted at the time of fastening the ferrule 11 by welding.

In addition, both ends in the minor axis direction of the optical fiber 3 of the ferrule 11 are welded with the fastening parts 110, 110 of the fastening members 117 at the positions P, P'. Thus, the displacing direction can be led such that the optical fiber 3 is displaced in the X-direction by the affect of welding.

Figure 3B:
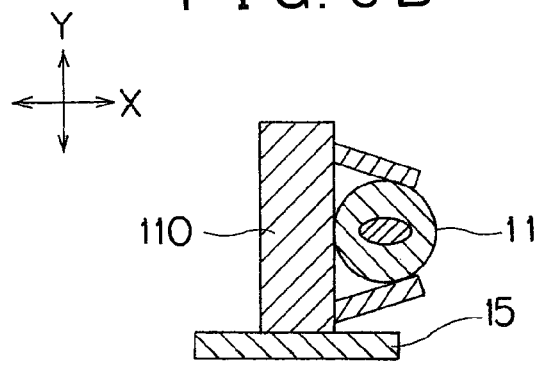

As shown in FIG. 3(b), if the optical fiber is a wedge-shaped lensed fiber, by making its major axis direction (the edge line direction of the wedge shape in FIG. 3(b)) agree with the major axis direction of the laser light at the emission end face, it is useful to suppress the reduction of the coupling efficiency.

Figure 3C:
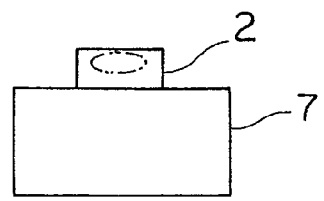

Moreover, if an elliptical core fiber whose core shape is elliptical is used, by making the direction of the displacement agree with the major axis direction of the elliptical shape, it is useful to suppress the reduction of the coupling efficiency. As shown in FIG. 3(c), the major axis direction of the elliptical shape of the laser light emitted form the semiconductor laser light element 2 is the X-direction.

Furthermore, the tip side fastening member 317 is formed to have a schematically "E" shape, the rear side fastening member 318 is formed to have a "U" shape, and the twisted groove 321 is formed in the tip side fastening member 317. When the ferrule 11 slightly moves upward and downward, the tip side fastening member 317 is twisted and then the twisted groove 321 enables the ferrule 11 to slightly move upward and downward. Thus, the ferrule 11 can be finely adjusted in the Y-direction. This improves the coupling efficiency.

Second Embodiment

Hereinafter, a second embodiment of the present invention is explained with reference to the drawings.

Figure 6:
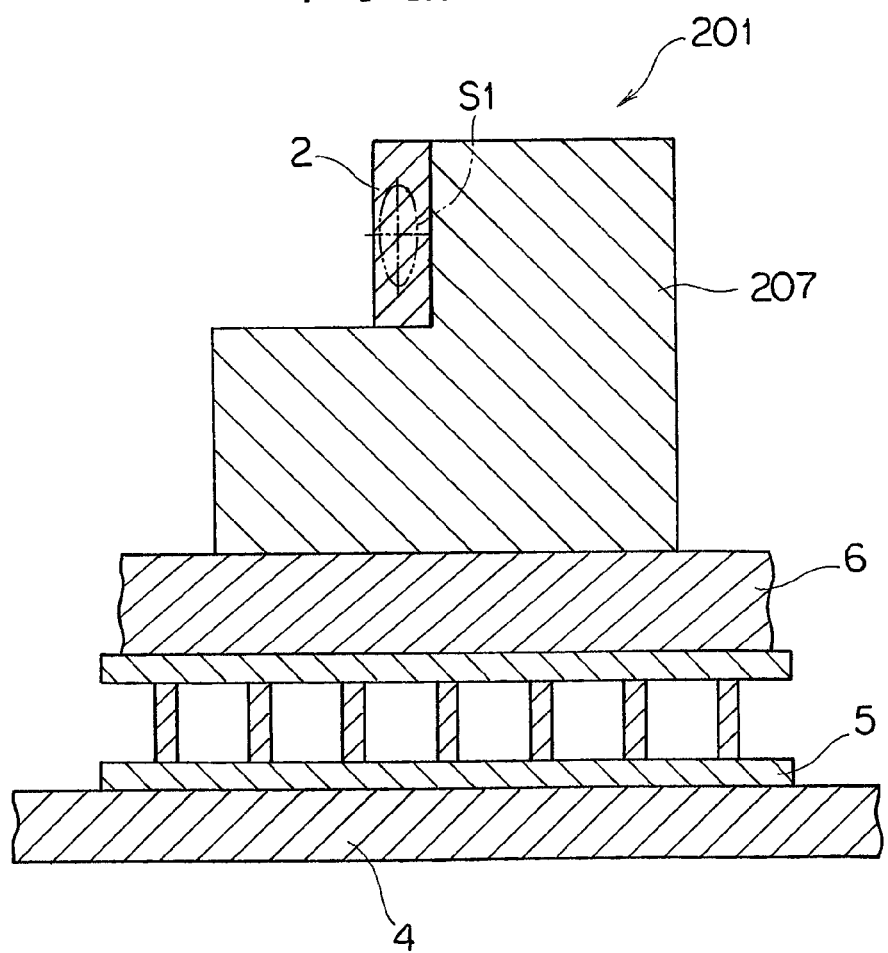
FIG. 6 is a cross-sectional view taken along the line IV-IV of FIG. 5 and is a view in which an arranging and fastening part of a ferrule is excerpted and schematically shown.

FIG. 5 is a schematic cross-sectional view showing a semiconductor laser module according to the second embodiment. FIG. 6 is a cross-sectional view taken along the line IV-IV of FIG. 5 and is a view in which a part for arranging and fastening a ferrule is excerpted and schematically shown.

In the following explanation, an X-direction means the depth direction of the paper of FIG. 5, a Y-direction means the vertical direction of the paper of FIG. 5, and a Z-direction means the horizontal direction of the paper of FIG. 5.

In the second embodiment, the semiconductor laser element 2 according to the first embodiment is rotated by 90 degrees and the welding part of the ferrule 11 is rotated by 90 degrees (the same structure as the conventional one). As the structure, an LD carrier 207 has a different structure. The fastening member 17 is a conventionally used one and the other structure is the same as that of the first embodiment. The same reference numerals are given to the same components as those shown in the conventional structure.

As shown in FIG. 6, the LD carrier 207 has a structure in which the semiconductor laser element 2 according to the first embodiment is supported in the state where it is rotated by 90 degrees. That is, the major axis direction of the elliptical shape of the laser light emitted from the semiconductor laser element 2 is the Y-direction and the minor axis direction is the X-direction. Similarly to the semiconductor laser element 2, the optical fiber 3 is mounted in the state where it is rotated by the same angle of 90 degrees. Thus, the major axis direction of the elliptical shape of the laser light emitted from the semiconductor laser element 2 at the emission end face agrees with the edge line direction of the wedge-shaped lens 12 mounted at the tip of the optical fiber 3.

The space between the fastening parts 10a and 10b of the fastening members 17 are formed to become approximately equal to the diameter of ferrule 11 of the optical fiber 3. That is, as shown in FIGS. 8 and 9, in the state where the ferrule 11 is incorporated therebetween, the fastening members 17 restricts both ends of the ferrule 11 in the X-direction.

The position of the ferrule 11 in the X-direction is set such that the center of the optical fiber 3 (more accurately, the center of the lens 12 positioned at the tip of the optical fiber 3) agrees with the center of the light emitting part of the semiconductor laser element 2 in the X-direction.

Figure 8:
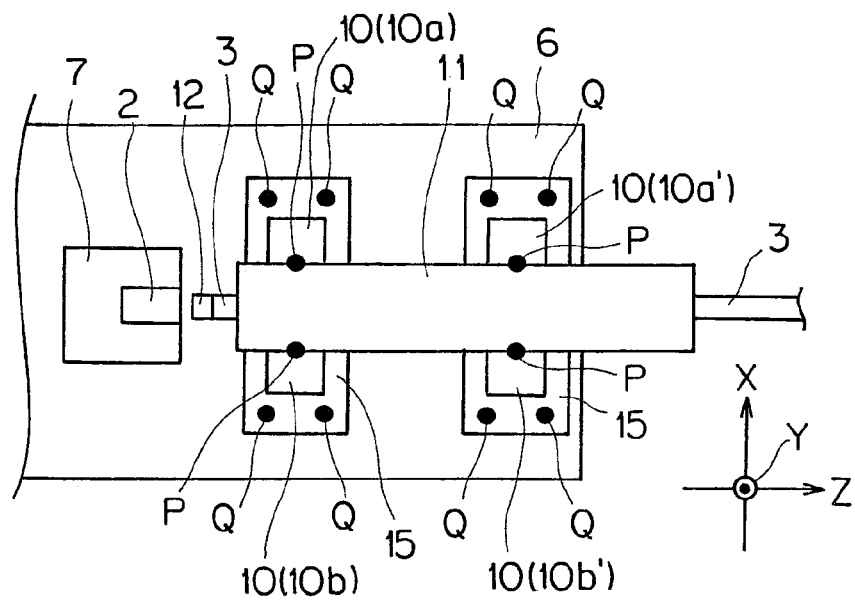
FIG. 8 is a schematic top view in which the arranging and fastening parts of the ferrule of the semiconductor laser module shown in FIG. 7 is excerpted and schematically shown.
Figure 9:
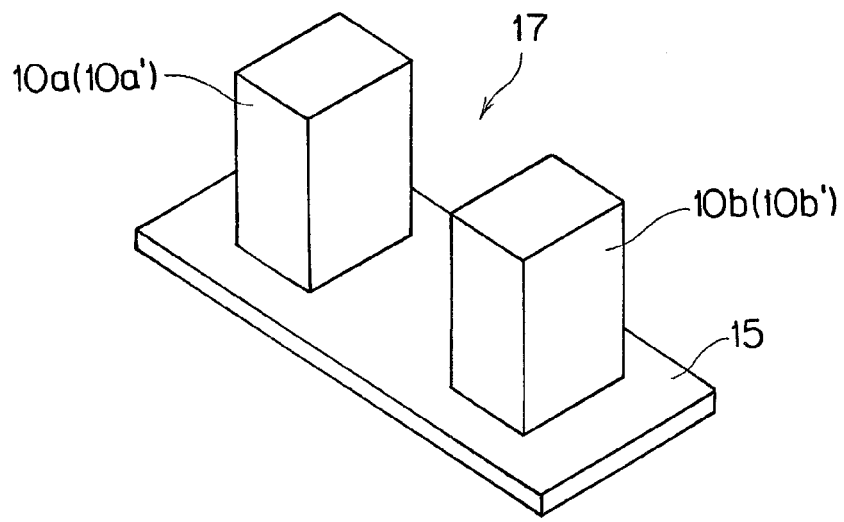
FIG. 9 is a model diagram showing one embodiment of a fastening member.

In order that the center of the optical fiber 3 and the center of the light emitting part of the semiconductor laser element 2 can be adjusted in the Y-direction in the state where the ferrule 11 is incorporated, some long distance is ensured between the fastening parts 10a and 10b in the X-direction (the vertical direction in FIG. 8).

As shown in FIG. 6, both left and right ends of the ferrule 11 in the X-direction are fastened by welding, etc., at the two positions of the fastening parts 10a and 10b (totally four welding positions). After both left and right ends are welded, the ferrule 11 is displaced in the Y direction by the effect of the welding heat.

Next, a connection structure of a wire for supplying a current to the semiconductor laser element 2 rotated by 90 degrees and mounted is explained with reference to FIGS. 12 and 13.

Figure 12:
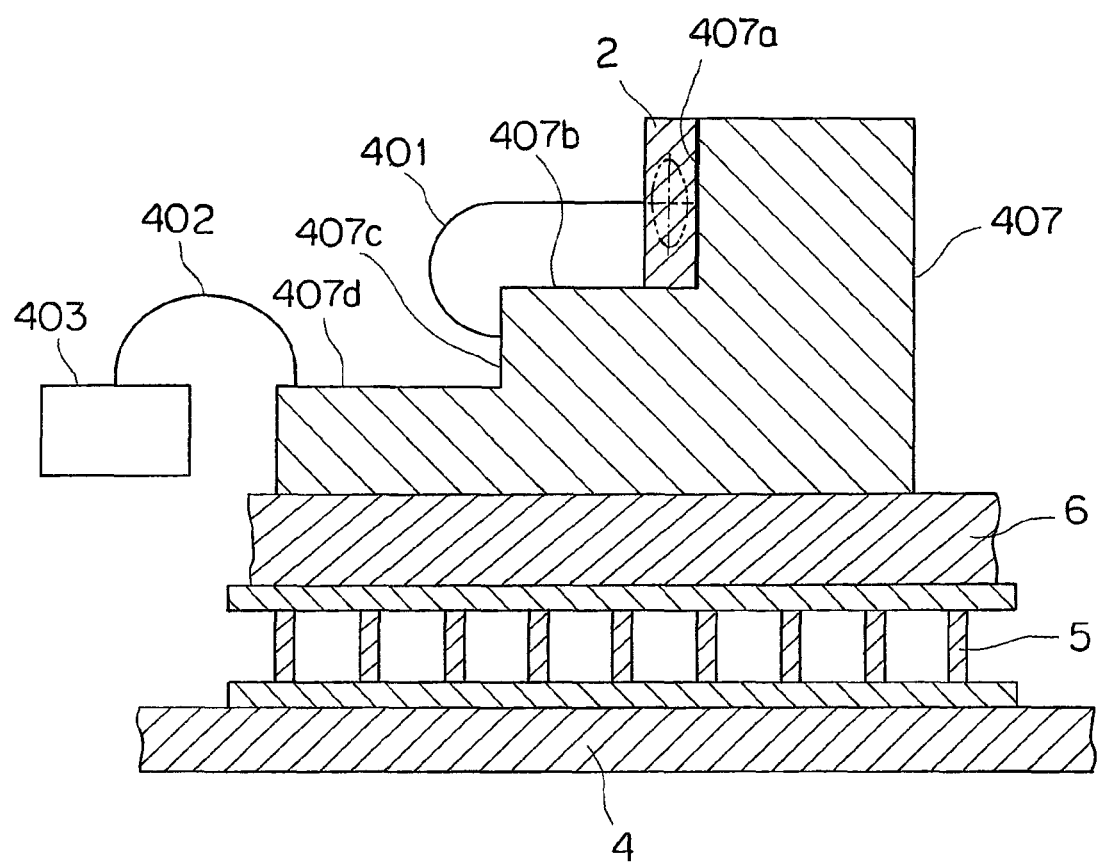
FIG. 12 is a front view showing a structure for connecting a wire to the semiconductor laser element according to the second embodiment.

In this structure, to connect a first wire 401 and a second wire 402 for supplying power as shown in FIG. 12, a LD carrier 407 is formed in a step-like shape so that it has two step heights. The power of a LD2 is transferred from a circuit board 403 to the LD carrier 407 through the second wire 402 and subsequently transferred to the LD2 through the first wire 401. Here, the LD carrier is, for example, conductive, and the power transferred from the second wire 402 is transferred to the first wire 401. A plating plate or a metallic plate may be patterned on the surface of the LD carrier 407, and wire bonding may be performed on this pattering.

As shown in FIG. 12, this LD carrier 407 includes a first standing surface 407a formed approximately vertically; a first horizontal surface 407b extending approximately horizontally from the bottom of the first standing surface 407a, a second standing surface 407c extending downward approximately vertically from the end of the first horizontal surface 407b; and a second horizontal surface 407d extending approximately horizontally from the bottom of the second standing surface 407c. The step-like shape is formed by theses shapes.

The LD2 is rotated by 90 degrees and is mounted on the first standing surface 407a via an insulator (not shown). One end of the first wire 401 extending approximately horizontally is fastened to the side part 2a of the LD2. The other end of the first wire 401 is fastened to the second standing surface 407c by wire bonding.

The other end of the first wire 401 is fastened on the second standing surface 407c by wire bonding.

That is, when the fastening is performed by wire bonding, the surfaces on which the first wire is mounted need to be approximately parallel. For this reason, the second standing surface 407c parallel to the side surface 2a of the LD2 is provided.

Similarly, one end of the second wire 402 is fastened on the second horizontal surface 407d and the other end is fastened by wire bonding on the circuit board 403 having a surface approximately parallel to the second horizontal surface 407d. Thus, it is possible to supply the power from the circuit board 403 to the LD2.

Figure 13:
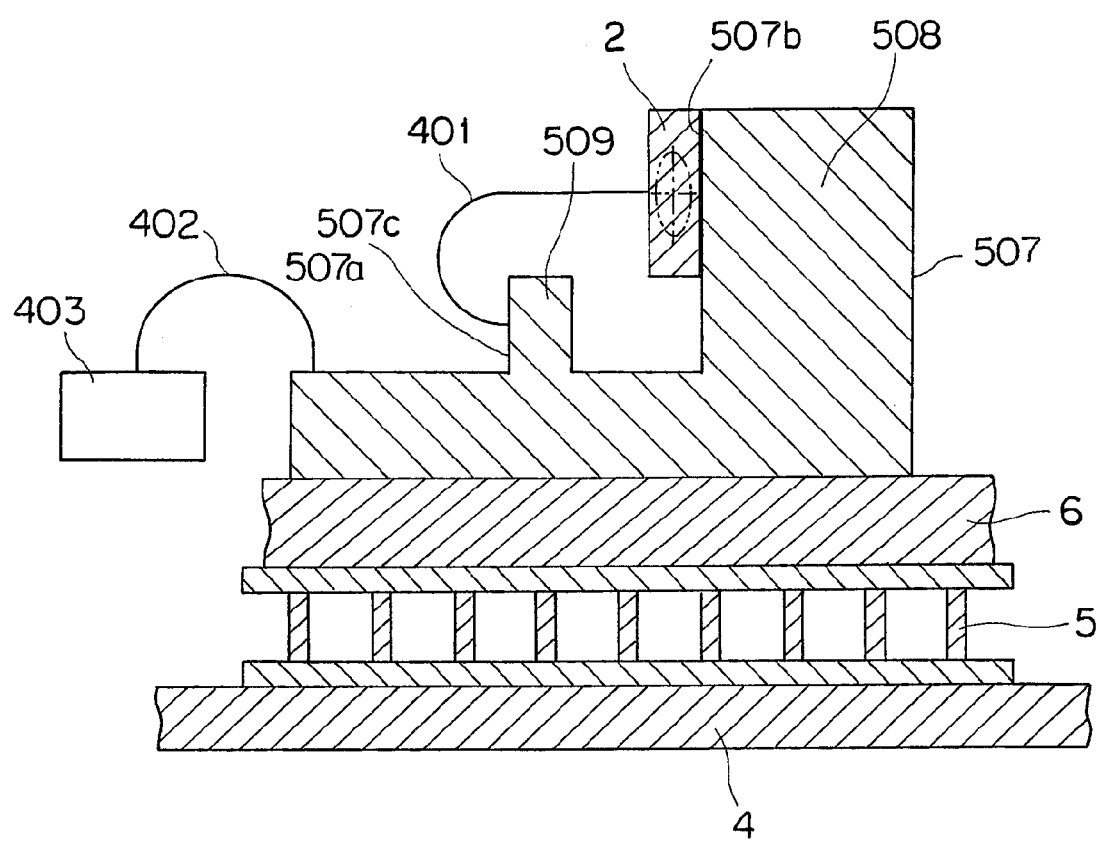
FIG. 13 is a front view showing another structure for connecting the wire to the semiconductor laser element according to the second embodiment.

On the other hand, instead of the above-described LD carrier 407, an LD carrier 507 having the shape shown in FIG. 13 can be used. This LD carrier 507 has an approximately horizontal flat surface 507a. Two projections (first projection 508 and second projection 509) protrude upward from the top face of this flat surface 507a.

A substantially perpendicular first standing surface 507b for mounting the LD2 is formed on the first projection 508. A substantially perpendicular second standing surface 507c is formed on the second projection 509. The ends of the first wire 401 are fastened by wire bonding to the side surface 2a of the LD2 and the first standing surface 507c. Moreover, the ends of the second wire 402 are fastened by wire bonding to the flat surface 507a and the circuit board 403.

Thus, it is possible to supply power from the circuit board 403 to the LD2.

The LD carriers 407 and 507 shown in FIGS. 12 and 13 are expressed as bodies separated from base 6. However, they may be integrally joined with the base 6. Moreover, the base 6 may be formed to have the above-described step-like shape, etc.

The semiconductor laser module 201 according to the second embodiment of the present invention has the following effects:

That is, the semiconductor laser module 201 includes: the fastening members 17 for fastening the optical fiber 3 by welding; and the LD carrier 207 for fastening the semiconductor laser element 2. The fastening members 17 are formed to restrict both ends which sandwiches the axis of the optical fiber 3 in the X-direction (the minor axis direction of the elliptical shape). Thus, it is possible to restrict the displacement of the ferrule 11 in the minor axis direction when it is fastened by welding.

Furthermore, the LD carrier 207 supports the semiconductor laser element 2 such that the minor axis direction of the laser light becomes approximately parallel to the line connecting both limited ends of the optical fiber (parallel to the X-direction). The ferrule 11 of the optical fiber 3 is fastened by welding at both limited ends. Thus, it is possible to lead the optical fiber 3 to be displaced in the Y-direction by the effect of welding.

The substantially perpendicular side surface 2a and the substantially parallel second standing surfaces 407c and 507c of the LD2 rotated by 90 degrees and mounted are formed on the LD carriers 407 and 507. The both ends of the first wire 401 are fastened by wire bonding on the side surface 2a and the substantially parallel second standing surfaces 407c and 507c. This facilitates the wire distribution for supplying the power from the circuit board 403.

Although the second embodiment of the present invention is described above, the present invention is not limited to the above-described embodiments and may be modified and changed in various ways based on the technical idea of the present invention.

For example, compared with the first embodiment, the semiconductor laser element 2 and the optical fiber 3 are rotated by 90 degrees and mounted in the second embodiment. However, the rotation angle may be other than 90 degrees as long as the relative positions of the semiconductor laser element 2 and the optical fiber 3 are determined such that their minor axes agree with each other and their major axes agree with each other and as long as the displacing direction by welding becomes the major axis direction.

That is, the semiconductor laser module 201 includes: the fastening member for fastening the optical fiber 3 by welding and the LD carrier for fastening the semiconductor laser element 2. The fastening members are formed such that they restrict both ends which sandwich the center of the optical fiber 3. The LD carrier supports the semiconductor laser element 2 such that the minor axis direction of the laser light becomes approximately parallel to the line connecting both limited ends of the optical fiber 3. By fastening both limited ends of the optical fiber 3 by welding, the displacing direction by welding can be limited to the major axis direction. Thus, even if the displacement amount by welding has some variations, it is possible to maintain the high coupling efficiency. Moreover, when a plurality of products are manufactured, the variation in coupling efficiency for each product can be reduced.

In the above embodiments, the ferrule and the fastening member are fastened by welding. However, they may be fastened by soldering, etc. The effects of the present invention can be also obtained at the time of using low melting glass or adhesive which contracts when it is hardened or which varies across the ages.

In the above embodiments, the optical coupling between the optical fiber and the semiconductor laser element is explained as the most preferable example. However, when the optical coupling between optical parts in which at least one of an incident and light receiving parts has anisotropy is designed, the present invention can be also applied to a mounting (fastening) method of such optical parts.

DESCRIPTION OF REFERENCE NUMERALS

1 . . . laser module
2 . . . element (LD)
2a . . . side part
3 . . . optical fiber
4 . . . package
5 . . . temperature control module
6 . . . base
7 . . . LD carrier
8 . . . PD carrier
9 . . . photo diode
10 . . . fastening part
10a . . . fastening part
11 . . . ferrule
11a . . . front end face
11b . . . rear end face
12 . . . lens
15 . . . base part
17 . . . fastening member
101 . . . semiconductor laser module
110 . . . fastening part
117 . . . fastening member
180 . . . ferrule fastening groove
201 . . . semiconductor laser module
207 . . . LD carrier
317 . . . tip side fastening member
317a . . . upper stage support part
317b . . . middle stage support part
317c . . . bottom part
317d . . . vertical support part
318 . . . rear side fastening member
319 . . . upper opening
320 . . . ferrule fastening groove
321 . . . twisted groove
401 . . . first wire
402 . . . second wire
403 . . . circuit board
407 . . . LD carrier
407a . . . first standing face
407b . . . first horizontal surface
407c . . . second standing face
407d . . . second horizontal surface
507 . . . LD carrier
507a . . . flat face
507b . . . first standing face
507c . . . second standing face
508 . . . first projection
509 . . . second projection
S1 . . . elliptical shape of a laser light
S2 . . . elliptical shape at a light receiving face

What is claimed is:

1. A semiconductor laser module comprising:
a semiconductor laser element for emitting a laser light whose cross-sectional shape at an emission end face is elliptical;
an optical fiber arranged to receive the laser light from the semiconductor laser element;
a package for housing the semiconductor laser element and the optical fiber;
a first fastening means for fastening the optical fiber to the package; and
a second fastening means for fastening the semiconductor laser element to the package, wherein
the first fastening means fastens a tip side of the optical fiber to the package without restricting the optical fiber in a direction of a major axis of the elliptical shape of the laser light such that a minor axis of the elliptical shape of the laser light becomes parallel to a line connecting both fastening positions that is restricted by the first fastening means and fastens a rear of the optical fiber to the package such that the major axis of the elliptical shape of the laser light becomes parallel to a line connecting both fastening positions that is restricted by the first fastening means.

2. The semiconductor laser module according to claim 1, wherein the fastening after alignment is one of fastening by welding, fastening by soldering, fastening by adhesive, and fastening by low-melting glass.

3. The semiconductor laser module according to claim 1, wherein the optical fiber is a wedge-shaped lensed fiber, and a direction of an edge line of the wedge shape agrees with that of a major axis direction at the emission end face of the laser light.

4. The semiconductor laser module according to claim 1, wherein the optical fiber is mounted in a groove provided for the first fastening means and is fastened at both ends of the groove, or the optical fiber is arranged on a mounting face of the first fastening means and partially fastened by sides of pieces at both side faces of the optical fiber.

5. The semiconductor laser module according to claim 1, wherein the semiconductor laser element is fastened such that the major axis of the elliptical cross-sectional shape at the emission end face of the laser light emitted from the semiconductor laser element becomes parallel to a bottom plate of the package; and after alignment, the optical fiber is fastened on a side face of the mounting face of a first fastening means provided vertically to the bottom plate of the package.

6. The semiconductor laser module according to claim 1, wherein the semiconductor laser element is fastened such that the major axis of the elliptical cross-sectional shape at the emission end face of the laser light emitted from the semiconductor laser element becomes vertical to a bottom plate of the package; and after alignment, the optical fiber is fastened on a mounting face of the first fastening means provided parallel to the bottom plate of the package.

* * * * *